(12) United States Patent
Ludowise et al.

(10) Patent No.: US 6,995,402 B2
(45) Date of Patent: Feb. 7, 2006

(54) INTEGRATED REFLECTOR CUP FOR A LIGHT EMITTING DEVICE MOUNT

(75) Inventors: Michael J. Ludowise, San Jose, CA (US); Jerome C. Bhat, San Francisco, CA (US)

(73) Assignee: Lumileds Lighting, U.S., LLC, San Jose, CA (US)

( * ) Notice: Subject to any disclaimer, the term of this patent is extended or adjusted under 35 U.S.C. 154(b) by 0 days.

(21) Appl. No.: 10/678,279

(22) Filed: Oct. 3, 2003

(65) Prior Publication Data

US 2005/0072980 A1 Apr. 7, 2005

(51) Int. Cl.
*H01L 29/22* (2006.01)
*H01L 29/205* (2006.01)
*H01L 29/207* (2006.01)

(52) U.S. Cl. ............................ 257/91; 257/93; 257/98; 257/99

(58) Field of Classification Search .................. 257/81, 257/82, 91, 93, 95, 98, 99, 100
See application file for complete search history.

(56) References Cited

U.S. PATENT DOCUMENTS

| 5,003,357 | A | * | 3/1991 | Kim et al. ...................... 257/98 |
| 5,813,753 | A | * | 9/1998 | Vriens et al. ................ 362/293 |
| 6,114,716 | A | | 9/2000 | Boles et al. ................. 257/207 |
| 6,150,197 | A | | 11/2000 | Boles et al. ................. 438/128 |
| 6,274,924 | B1 | | 8/2001 | Carey et al. ................. 257/676 |
| 6,333,522 | B1 | | 12/2001 | Inoue et al. ................... 257/99 |
| 6,355,946 | B1 | * | 3/2002 | Ishinaga ....................... 257/98 |
| 6,459,130 | B1 | * | 10/2002 | Arndt et al. ................. 257/432 |
| 6,486,499 | B1 | | 11/2002 | Krames et al. ................ 257/81 |
| 6,593,598 | B2 | * | 7/2003 | Ishinaga ....................... 257/98 |
| 6,737,681 | B2 | * | 5/2004 | Koda ........................... 257/98 |
| 6,774,405 | B2 | * | 8/2004 | Yasukawa et al. ............. 257/99 |
| 6,803,606 | B2 | * | 10/2004 | Takenaka ....................... 257/98 |
| 2002/0011601 | A1 | * | 1/2002 | Furukawa et al. ............. 257/98 |
| 2002/0070387 | A1 | * | 6/2002 | Wang et al. ................... 257/98 |
| 2002/0145152 | A1 | * | 10/2002 | Shimomura .................... 257/98 |
| 2003/0038295 | A1 | * | 2/2003 | Koda ........................... 257/98 |
| 2003/0085416 | A1 | | 5/2003 | Brogle et al. |
| 2003/0094622 | A1 | * | 5/2003 | Horiuchi et al. ............. 257/100 |
| 2003/0160256 | A1 | * | 8/2003 | Durocher et al. ............. 257/88 |
| 2003/0189830 | A1 | * | 10/2003 | Sugimoto et al. ........... 362/294 |
| 2003/0201451 | A1 | * | 10/2003 | Suehiro et al. ............... 257/98 |

(Continued)

FOREIGN PATENT DOCUMENTS

WO    WO 99/59206    11/1999

OTHER PUBLICATIONS

U.S. Appl. No. 10/632,719, filed Jul. 31, 2003, entitled "Mount For Semiconductor Light Emitting Device", 24 pages.

*Primary Examiner*—Ngân V. Ngô
(74) *Attorney, Agent, or Firm*—Patent Law Group LLP; Rachel V. Leiterman

(57) ABSTRACT

A mount for a semiconductor light emitting device includes an integrated reflector cup. The reflector cup includes a wall formed on the mount and shaped and positioned to reflect side light emitted from the light emitting device along a vertical axis of the device/mount combination. The wall may be covered by a reflective material such as a reflective metal.

22 Claims, 3 Drawing Sheets

U.S. PATENT DOCUMENTS

2004/0036081 A1 * 2/2004 Okazaki .................... 257/99
2004/0051111 A1 * 3/2004 Ota et al. .................. 257/98
2004/0056265 A1 * 3/2004 Arndt et al. ............... 257/98
2004/0065894 A1 * 4/2004 Hashimoto et al. ......... 257/100
2004/0211970 A1 * 10/2004 Hayashimoto et al. ........ 257/98
2004/0217692 A1 * 11/2004 Cho et al. ................. 313/503
2004/0227149 A1 * 11/2004 Ibbetson et al. ............ 257/100
2005/0001230 A1 * 1/2005 Takekuma .................. 257/100

* cited by examiner

US 6,995,402 B2

INTEGRATED REFLECTOR CUP FOR A LIGHT EMITTING DEVICE MOUNT

BACKGROUND

1. Field of Invention

The present invention is related to a mount for a light emitting device, the mount having an integrated reflector cup.

2. Description of Related Art

Semiconductor light emitting devices such as light emitting diodes (LEDs) are among the most efficient light sources currently available. Material systems currently of interest in the manufacture of high brightness LEDs capable of operation across the visible spectrum include group III–V semiconductors, particularly binary, ternary, and quaternary alloys of gallium, aluminum, indium, and nitrogen, also referred to as III-nitride materials; and binary, ternary, and quaternary alloys of gallium, aluminum, indium, and phosphorus, also referred to as III-phosphide materials. Often III-nitride devices are epitaxially grown on sapphire, silicon carbide, or III-nitride substrates and III-phosphide devices are epitaxially grown on gallium arsenide by metal organic chemical vapor deposition (MOCVD) molecular beam epitaxy (MBE) or other epitaxial techniques. Often, an n-type layer (or layers) is deposited on the substrate, then an active region is deposited on the n-type layers, then a p-type layer (or layers) is deposited on the active region. The order of the layers may be reversed such that the p-type layers are adjacent to the substrate.

LEDs are often mounted on a submount, then packaged. FIG. 1 illustrates a package described in more detail in U.S. Pat. No. 6,274,924, "Surface Mountable LED Package." LED 104 is attached to a submount 103. Leads 106 of leadframe 105 are electrically connected to the LED-submount combination. The LED-submount combination is disposed in a reflector cup 102 formed (such as by stamping) on a heat sink 100. Reflector cup 102 is designed to reflect any light emitted from the sides or bottom of LED 104 back toward the vertical axis of lens 108 so the light can be usefully extracted from the package. Submount 103 is generally larger than LED 104, in order to accommodate electrical contacts that must be made on submount 103. As a result, reflector cup 102 is large compared to the size of LED 104, thus reflector cup 102 significantly increases the size of the light source created by the package illustrated in FIG. 1.

SUMMARY

In accordance with embodiments of the invention, a mount for a semiconductor light emitting device includes an integrated reflector cup. The reflector cup includes a wall formed on the mount and shaped and positioned to reflect side light emitted from the light emitting device along a vertical axis of the device/mount combination. The wall may be covered by a reflective material such as a reflective metal.

DETAILED DESCRIPTION

Figure 2:
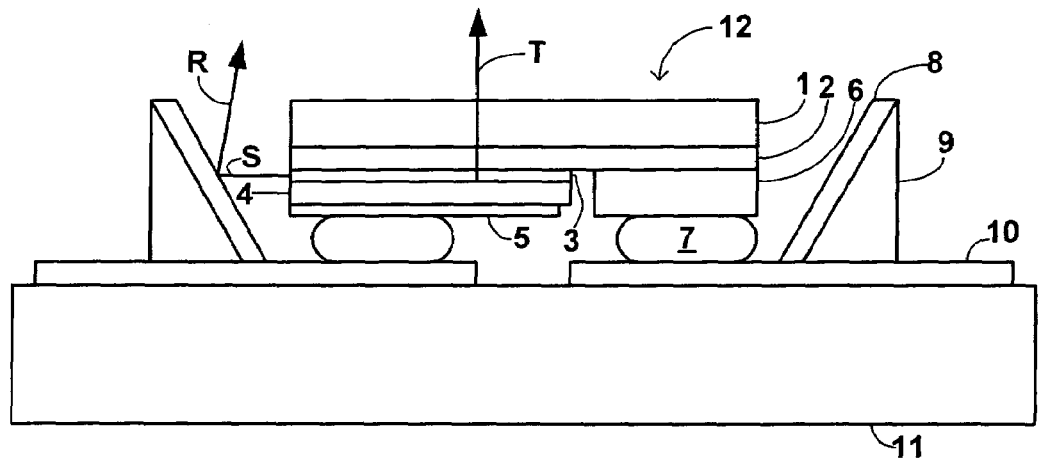
FIG. 2 is a cross sectional view of a light emitting device/mount combination according to an embodiment of the present invention.

FIG. 2 illustrates a cross sectional view of a mount for a semiconductor light emitting device with an integrated reflector cup, according to an embodiment of the present invention. In the embodiments described below, the word "submount" is used since the mount is often disposed beneath the light emitting device. The word "submount" is not meant to imply a structure different from a mount, or to imply a particular configuration. A light emitting device, including an n-type region 2, an active, light emitting region 3, and a p-type region 4 is formed on a substrate 1. A p-contact 5 is electrically connected to p-type region 4 and an n-contact 6 is electrically connected to n-type region 2. Submount interconnects 7 which may be, for example, solder or gold, connect light emitting device 12 to contact pads 10 on submount 11. Submount 11 may be, for example, a silicon device including integrated circuitry.

Submount 11 includes reflective walls 9. Light emitting device 12 emits top light T though the top of device 12 and side light S out the side of device 12. Walls 9 have an angled surface facing light emitting device 12, in order to reflect side light S along a vertical axis of the device/submount combination so that the reflected light R can be usefully extracted from the device/submount combination. The angle of the reflective surface may be selected based on the pattern of light emitted from light emitting device 12. Though walls 9 of FIG. 2 have a straight surface facing the device, other surfaces may be used, such as a parabolic surface. Other useful profiles can be devised including multiple straight segments, multiple curved segments, or combinations of the two.

Walls 9 may be made reflective by using a reflective material such as a reflective metal to form the walls, by coating the walls with a reflective material such as a reflective metal or a reflective dielectric stack, or by creating a contrast in refractive index between the walls and the material adjacent to the walls.

FIG. 2 illustrates an embodiment with an optional reflective coating 8 formed on walls 9, for example by masking the submount except for walls 9, then evaporating coating 8 over walls 9. Alternatively, reflective coating 8 may be formed on all of submount 11 then patterned to remove the coating on regions other than walls 9. Coating 8 may be a reflective metal, chosen to be reflective of light emitted by light emitting device 12. Examples of suitable metals include Al, Ag, Au, Pt, Pd, In, Ni, and Cr. In some embodiments, the reflective metal may be coated with a dielectric layer. Coating 8 may also be a reflective dielectric stack chosen to be reflective of light emitted by light emitting device 12. Examples of dielectric stacks include any combination of alternating high-refractive index and low-refractive index dielectrics. Examples of high-refractive index materials include III-nitride materials, and oxides of titanium, hafnium, zirconium, tantalum, tin, manganese, and antimony. Examples of low-refractive index materials include oxides of silicon, nitrides of silicon, oxy-nitrides of silicon, aluminum oxides, and fluorides of lithium, calcium, and magnesium. An optional material (not shown) may be disposed between device 12 and walls 9. The material is included to facilitate light extraction from the device by matching the index of refraction of the light extraction surface of device 12, often a sapphire or SiC substrate when the device is mounted in a flip chip configuration, as illustrated in FIG. 2. Examples of suitable materials for a device with a sapphire substrate include epoxy or silicone with a refractive index between about 1.4 and about 1.7.

Figure 4:
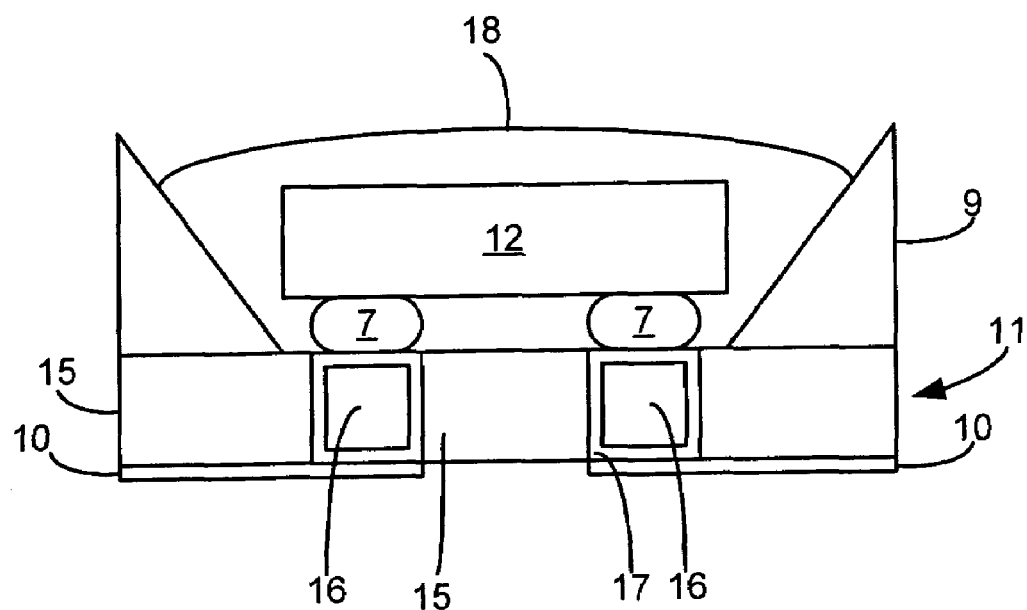
FIG. 4 is a cross sectional view of an alternative embodiment of a light emitting device/mount combination.

FIG. 4 illustrates an alternative embodiment, where reflection at walls 9 is created by a contrast in index of refraction. In the device of FIG. 4, walls 9 are a low index material, and a material 18 having a high index of refraction is disposed between device 12 and walls 9, creating a high-to-low contrast in index of refraction at the interface of material 18 and wall 9. The angle of walls 9 is then selected to create total internal reflection. For example, wall 9 may be a solid piece of low index plastic or dielectric material and material 18 may be a high index epoxy or silicone, such that light is reflected at the interface between wall 9 and material 18. Alternatively, wall 9 may be air encapsulated in a plastic material having a high index matched to the index of material 18, such that light is reflected at the interface between the encapsulated air and the high index plastic.

Figure 3:
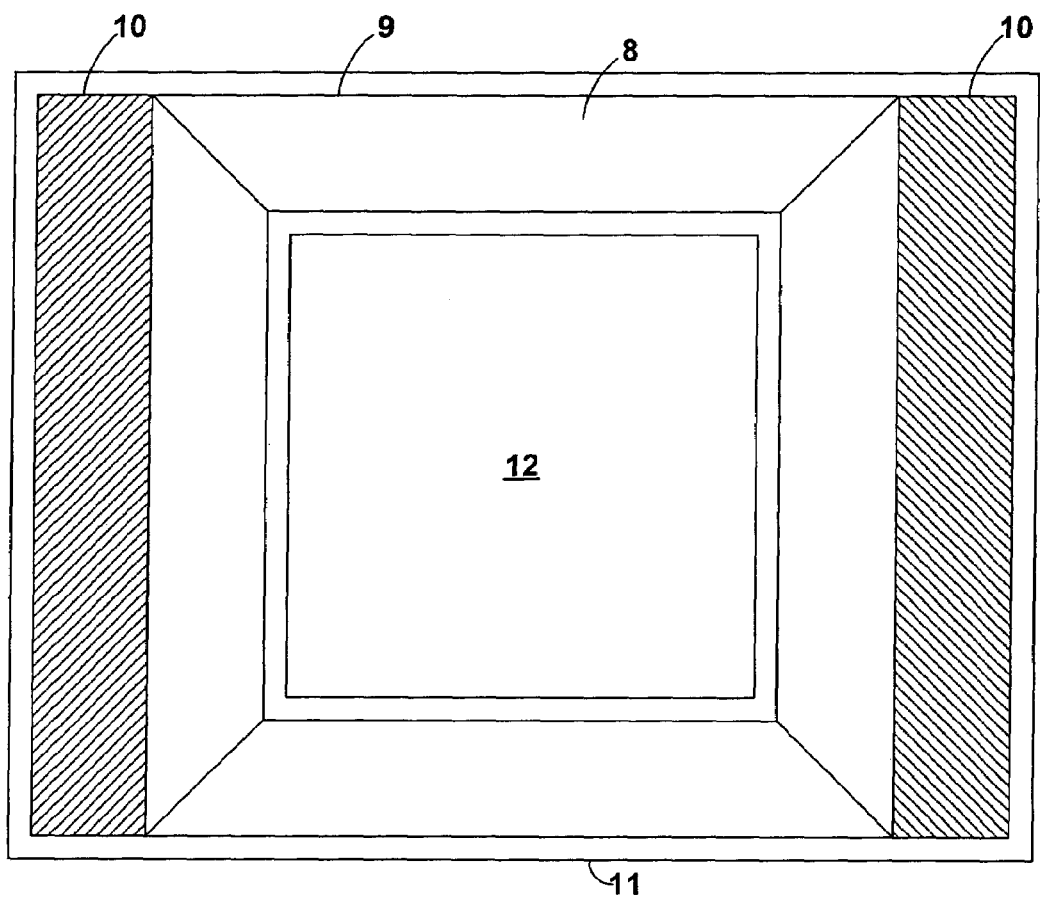
FIG. 3 is a plan view of the combination of FIG. 2.

Any embodiment of reflective walls described above may be formed on any suitable submount. FIGS. 2 and 4 illustrate two examples of submounts. In the device/submount combination of FIG. 2, device 12 is mounted by interconnections 7 to contacts 10 on submount 11. FIG. 3 is a plan view of the device illustrated in FIG. 2. Light emitting device 12 is disposed in the center of reflective walls 9. Contacts 10 extend beyond reflective walls 9 to permit connection of submount 11 to another device, for example by wire bonds.

FIG. 4 is a cross sectional view of an alternative embodiment of a device/submount combination. In the device of FIG. 4, contacts 10 on submount 11 are formed on the surface of the submount opposite the surface on which device 12 is mounted, rather than on the same surface as the device, as in FIG. 2. Submount 11 may be, for example, a silicon/glass composite submount with regions of silicon 16, and regions of glass 15 surrounded by conductive material 17 for making electrical connections between device 12 and contacts 10 on the back side of submount 11. Submounts such as the submount illustrated in FIG. 4 are described in more detail in U.S. application Ser. No. 10/632,719, titled "Mount For Semiconductor Light Emitting Device," filed Jul. 31, 2003, and incorporated herein by reference. In other embodiments, the submount may be a ceramic such as an oxide of aluminum or a nitride of aluminum, or a polymer such as FR4, used for printed circuit boards. Ceramic submounts for semiconductor light emitting devices are described in more detail in U.S. application Ser. No. 10/652, 348, titled "Package for a Semiconductor Light Emitting Device," filed Aug. 29, 2003, and incorporated herein by reference.

In the embodiment illustrated in FIG. 3, both device 12 and reflective walls 9 are square, and submount 11 is rectangular. Other shapes for each are possible. For example, reflective walls 9 may be circular, shaped to fit a particular submount shape or light emitting device shape, or shaped to obtain a particular light emission profile.

Walls 9 of either FIG. 2 or FIG. 4 may be formed by, for example, depositing a thick film on the submount wafer during the manufacture of submount 11, then shaping the thick film to form walls 9. The film may be deposited to a thickness between about the height of device 12 plus about 25% and about ten times the height of device 12. Examples of suitable thick films are BCB available from Dow Chemical, PMMA, photoresist, glass, spin-on-glass, polyamides, and metals such as Al, Ag, Au, Pt, Pd, In, Ni, and Cr. The thick film may be spun on submount 11, plated, or deposited using any other suitable technique. The thick film may be deposited in the form of walls 9 or shaped to form walls 9 using standard photolithographic techniques such as, for example, masking and gas etching. Alternatively, walls 9 may be formed separately from submount 11 as, for example, a ring or square, then bonded to submount 11 by an adhesive such as glue or epoxy, or through the application of pressure and temperature, or by soldering, or thermosonic welding.

Figure 1:
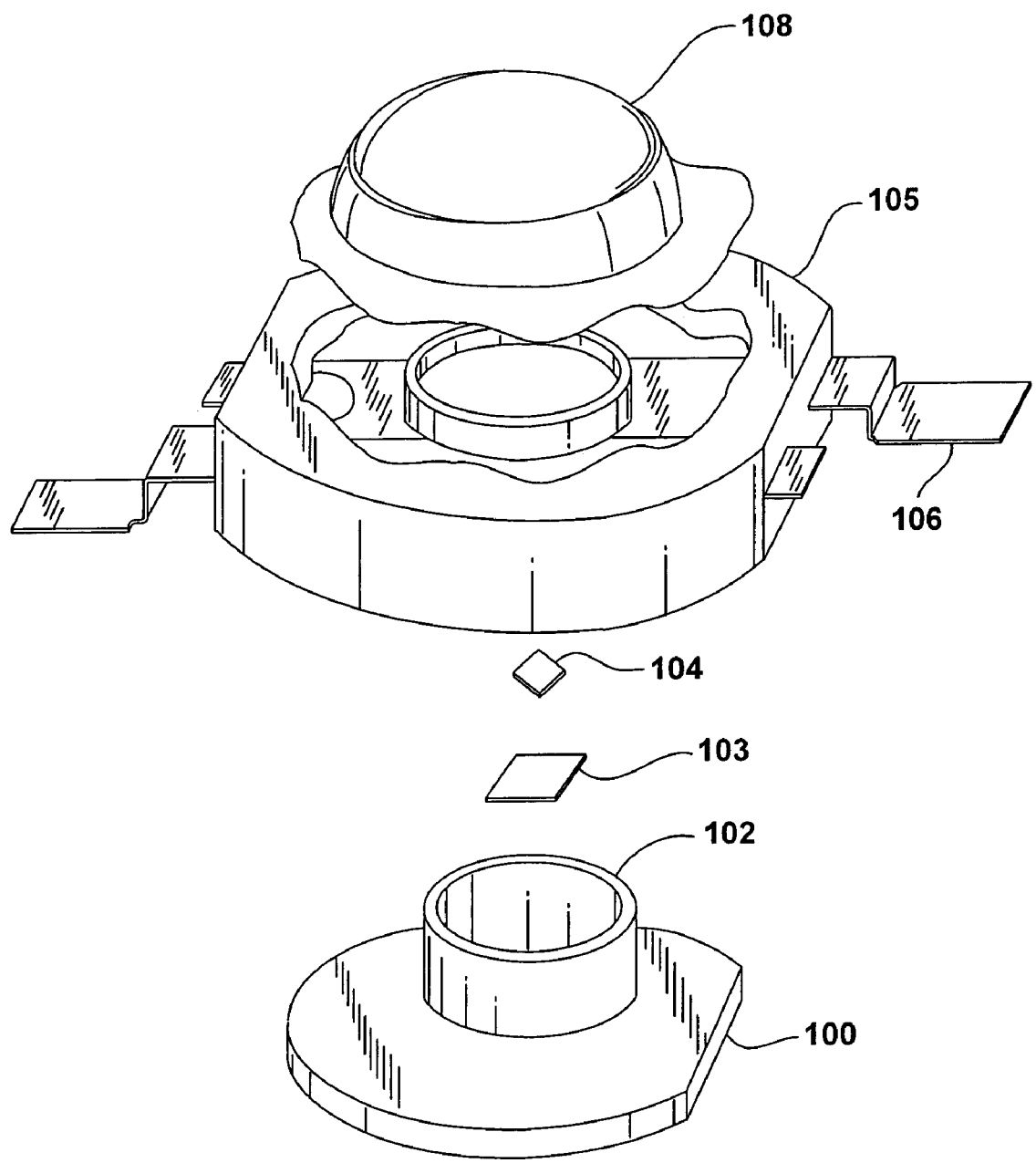
FIG. 1 illustrates a prior art LED package.

A reflector cup formed on a submount as illustrated in FIGS. 2–4 may offer several advantages over the reflector cup illustrated in FIG. 1. The walls of the reflector cup of FIGS. 2–4 can be located very close to the light emitting device, thus the reflector cup of FIGS. 2–4 is far smaller than the reflector cup of FIG. 1, resulting in a smaller light source size, which is suitable for more applications than a larger light source. Reducing the size of the source may reduce the cost of a finished device including the device/submount combination, because a smaller source requires smaller optics which are generally less expensive than larger optics. In addition, the device of FIGS. 2–4 eliminates the stamping of reflector cup 102 of FIG. 1.

Figure 5:
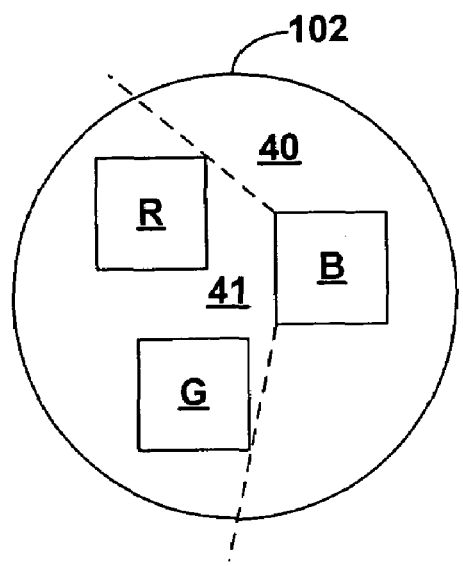
FIG. 5 illustrates multiple light emitting devices disposed in the reflector cup of FIG. 1.

A further advantage of the device of FIGS. 2–4 is illustrated in FIG. 5, which shows multiple light emitting devices disposed in a single reflector cup of FIG. 1. Three light emitting devices which may be, for example, a red R, a green G, and a blue B device, emit light within reflector cup 102. Reflector cup 102 is only visible to a portion of the light emitted by each of the devices. For example, in the case of device B, light emitted in region 40 may be incident on reflector cup 102, but at least a portion of light emitted in region 41 is blocked by devices R and G. Devices R and G and structures mounting devices R and G in reflector cup 102 may absorb or scatter light emitted by B that is incident on them, reducing the amount of light usefully extracted from reflector cup 102. The use of reflector cups formed on the submount as illustrated in FIGS. 2–4 avoids this problem because each device has its own reflector cup that cannot be blocked by the presence of another device.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is claimed is:

1. A device comprising:
   a semiconductor light emitting device; and
   a mount comprising:
      a body comprising silicon, the body having a substantially flat surface, and
      a quantity of material attached to the substantially flat surface of the body, the quantity of material forming a wall; wherein:
      the wall is reflective to light emitted from the semiconductor light emitting device; and
      the semiconductor light emitting device is attached to the mount.

2. The device of claim 1 wherein the quantity of material is reflective.

3. The device of claim 1 further comprising a reflective layer formed on the wall.

4. The device of claim 3 wherein the reflective layer is reflective of light emitted by the semiconductor light emitting device.

5. The device of claim 3 wherein the reflective layer comprises a metal selected from the group of Al, Ag, Au, Pt, Pd, In, Ni, and Cr.

6. The device of claim 3 wherein the reflective layer is a metal.

7. The device of claim 6 further comprising a dielectric layer overlying the metal reflective layer.

8. The device of claim 3 wherein the reflective layer comprises a dielectric stack.

9. The device of claim 1 wherein the mount comprises a material selected from the group of silicon, ceramic, polymer, FR4, oxides of aluminum, and nitrides of aluminum.

10. The device of claim 1 wherein the quantity of material comprises one of BCB, PMMA, photoresist, polyamides, glass, spin-on-glass, Al, Ag, Au, Pt, Pd, In, Ni, and Cr.

11. The device of claim 1 wherein the wall has a height between about a height of the semiconductor light emitting device plus 25% and about ten times the height of the semiconductor light emitting device.

12. The device of claim 1 further comprising a plurality of leads electrically connected to the semiconductor light emitting device and a cover overlying the semiconductor light emitting device.

13. The device of claim 1 wherein the wall is angled.

14. The device of claim 1 wherein the wall is parabolic.

15. The device of claim 1 wherein the wall is shaped and positioned to reflect light emitted by the semiconductor light emitting device.

16. The device of claim 1 wherein the quantity of material is a quantity of first material, the device further comprising a quantity of second material disposed between the device and the wall.

17. The device of claim 16 wherein quantity of second material has a higher index of refraction than the quantity of first material.

18. The device of claim 16 wherein the quantity of second material comprises air.

19. The device of claim 16 wherein the quantity of first material encapsulates a region of air.

20. The device of claim 16 wherein the quantity of second material comprises one of epoxy and silicone.

21. The device of claim 16 wherein the quantity of second material has an index of refraction between about 1.4 and about 1.7.

22. The device of claim 1 further comprising an adhesive disposed between the quantity of material and the body.

* * * * *